United States Patent [19]

Kondoh

[11] Patent Number: 6,078,171
[45] Date of Patent: Jun. 20, 2000

[54] DRY TYPE LOAD RESISTOR FOR TESTING GENERATORS OR THE LIKE

[75] Inventor: Toyoshi Kondoh, Tokyo, Japan

[73] Assignee: Tatsumi Corporation, Tokyo, Japan

[21] Appl. No.: 09/137,824

[22] Filed: Aug. 21, 1998

[51] Int. Cl.[7] .................................................. G05B 24/02
[52] U.S. Cl. ......................................................... 323/354
[58] Field of Search .................................... 323/354, 222, 323/282, 284; 338/51, 322, 268

[56] References Cited

U.S. PATENT DOCUMENTS

| | | | |
|---|---|---|---|
| 4,238,724 | 12/1980 | Klaus et al. ........................... | 323/354 |
| 4,849,903 | 7/1989 | Fletcher et al. ....................... | 323/354 |
| 5,923,159 | 7/1999 | Ezell ...................................... | 323/354 |

*Primary Examiner*—Edward H. Tso
*Assistant Examiner*—Gary L. Laxton
*Attorney, Agent, or Firm*—Wenderoth, Lind & Ponack, L.L.P.

[57] ABSTRACT

A dry type load resistor for testing a generator or comprises a switching circuit made up of a semiconductor element, a testing load resistor circuit connected in series therewith, a controller for controlling a current supply to the switching circuit, and a programmable logic controller for sending a control instruction to the controller.

1 Claim, 7 Drawing Sheets

DRY TYPE LOAD RESISTOR FOR TESTING GENERATORS OR THE LIKE

BACKGROUND OF THE INVENTION

The present invention relates to a dry type load resistor used for the purpose of testing generators, etc.

One problem with generator tests using water as a resistance material is that a large-sized load resistor is needed due to the use of large amounts of water.

Another problem is that impurities must be removed from the water, resulting in the need of using complicated, and costly testing apparatuses.

To provide a solution to these problems, there is proposed a dry type load resistor that can be used for generator tests in the absence of water. This dry type load resistor now attracts great attention.

Referring to a typical generator test carried out so far in the art, a switch is inserted in a main power circuit from a generator to a load resistor, and the switch is then closed to supply a current thereto. The switch has a vacuum-contained make-and-break contact.

This switch, albeit costing much, has a robustness problem. Hence, regular replacement of switches is needed.

In view of such problems as mentioned above, an object of the present invention is to provide a dry type load resistor that is inexpensive and ensures main switching operations with an improved robustness.

SUMMARY OF THE INVENTION

According to one aspect of the invention, there is provided a dry type load resistor for testing a generator or the like, comprising a switching circuit (31) made up of a semiconductor element, a testing load resistor circuit (12) connected in series therewith, a controller (32) for controlling a current supply to said the switching circuit (31), and a programmable logic controller (30) for sending a control instruction to the controller.

According to another aspect of the invention, there is provided a dry type load resistor unit for testing a generator or the like, comprising:

a substantially rectangular form of frame (11), a plurality of resistor circuits (12) housed therein, each of the resistor circuits (12) comprising a rectangular form of frame (13), and a load resistor assembly comprising a substantially cylindrical substrate material (1), a plurality of ring-like members (2) inserted over the substrate material (1) at a given interval in a longitudinal direction of the substrate material (1), a resistance material (3) inserted through the substrate material (1), an insulating member (4) filled between the resistance material (3) and an inner wall of the substrate material (1), and insulating members (6) located between both ends of the substrate material (1) and connecting terminals (5) disposed outside of the both ends of the substrate material (1) and connected to the resistance material (3), the plurality of resistor circuits (12) connected together via adjoining connecting terminals (5), and the plurality of resistor circuits (12) incorporated in said frame 11 in a plurality of stages while one stage of resistor circuits (12) are located at a position where the resistor circuits (12) do not overlap upper and lower stages of resistor circuits (12), switching circuits (31), each made up of a semiconductor element, connected in series with the plurality of resistor circuits (12), so that the switching circuits (31) can be driven on or off by a single controller (32), and a programmable logic controller (30) for sending control instructions to the controller (32).

BRIEF DESCRIPTION OF THE DRAWINGS

The above and other objects, features, and advantages of the present invention will be better understood from the following description taken in conjunction with the accompanying drawings, in which.

DETAILED DESCRIPTION OF THE INVENTION

Figure 7:
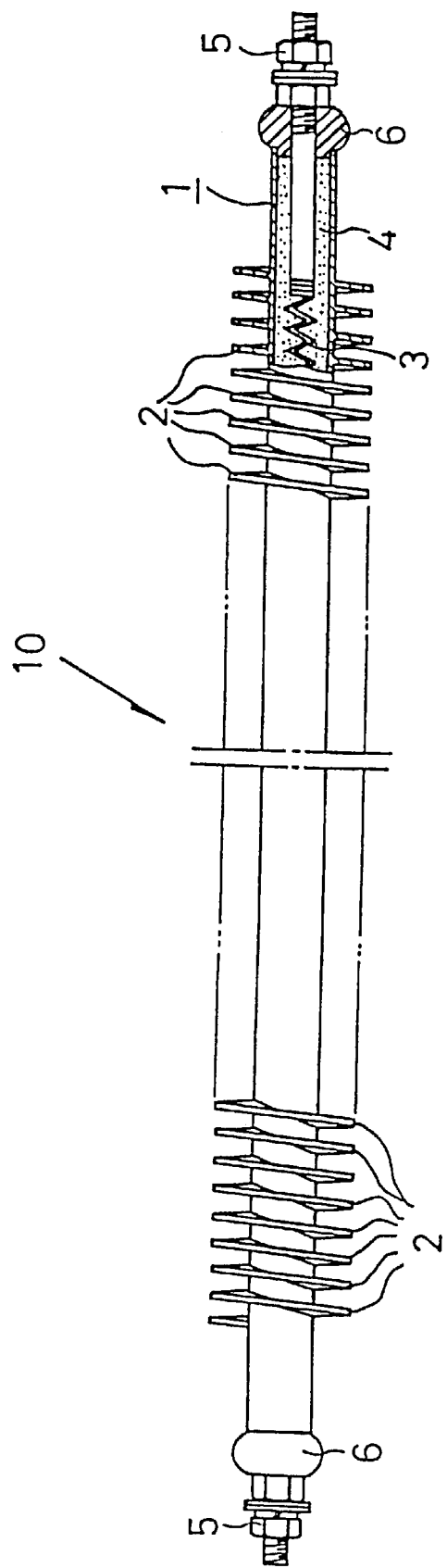
FIG. 7 is illustrative of one construction of the resistor for a load resistor.

First, the present invention is explained with reference to FIG. 7. FIG. 7 is a general schematic of a load resistor assembly 10 that is an essential part of the dry type load resistor system for testing generators, etc. according to the present invention.

In FIG. 7 a substrate material 1 is in a substantially cylindrical form of usually 1 meter in length. It is noted that the length of the substrate material is not critical in the present invention.

The substrate material 1 is provided on its periphery with an array of rings or other members 2, which are placed at an interval of about 7 mm in its longitudinal direction. It is again noted that the present invention is not limited to the interval of 7 mm.

The substrate material 1 has a resistance material 3 such as a heating wire inserted therethrough.

A current is fed to the resistance material 3 in the load resistor assembly 10 to make an examination of whether or not a generator or the like is in normal operation.

The array of rings 2 function to radiate heat generated by feeding the current to the resistance material 3.

Between the substrate material 1 and the inner wall of the resistance material 3 there is filled an insulating material 4 composed of insulating powders.

Connecting terminals 5 are provided at both ends of the substrate material 1 for connection with the resistance material 3. The load resistor assembly 10 is connected through the connecting terminal 5 to adjacent load resistor assemblies 10.

Insulating members 6, made of Teflon or ceramics, are located between the connecting terminals 5 and both ends of the substrate material 1.

The insulating members are each in an outwardly bulging, oval form, thereby ensuring that even when dust, etc. are deposited on the insulating members, they can be easily eliminated. Consequently, it is unlikely that the insulating members are heated and fused down.

Preferably, the length of the insulating member 6 between the end of the substrate material and the connecting terminal 5 is at least about 1 cm for the following reason.

For instance, when a three-phase AC high-voltage generator of 6,600 V is tested, a voltage of at least 3,819 V is applied per phase. Even though an intermediate potential is applied to a unit/outer frame 11 (as will be explained with reference to FIG. 3), a voltage of about 1,910 V is applied to the load resistor assembly 10. In other words, the load resistor assembly 10 must have a dielectric strength of at least 2,000 V so as to ensure insulation of the substrate material 1 from the connecting terminals 5.

This ensures prevention of discharge from between the insulating members and the connecting terminals of the substrate material during testing.

Figure 2:
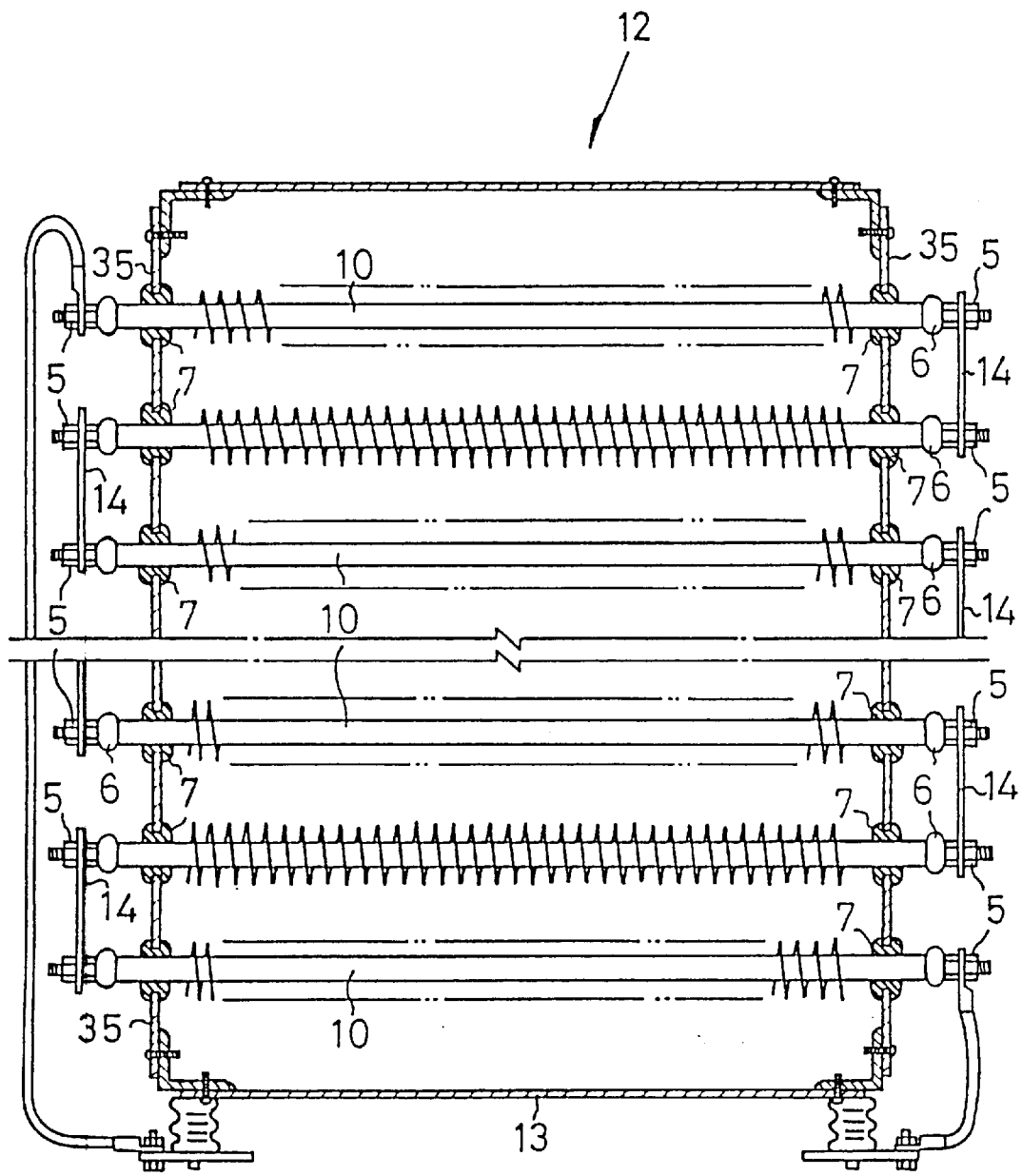
FIG. 2 is illustrative of how the embodiment of the invention is used.

Referring then to FIG. 2 which is a general scheme of a resistor circuit 12, the resistor circuit 12 is formed by connecting a plurality of load resistor assemblies 10 at adjoining connecting terminals 5.

Reference numeral 13 represents a frame of a rectangular shape or other shape, on which, for instance, 10 such load resistor assemblies are mounted at a given interval. Mount portions 35 of the rectangular frame 13, on which at least the load resistor assemblies 10 are mounted, are made up of insulating material such as glass fibers or ceramics, thereby securing the safety of load testing.

Each load resistor assembly 10 is inserted and held at both ends through holes in the mount portions 35. To ensure insulation, a ring support member 7 again made up of insulating material such as ceramics is inserted in each hole.

When a three-phase AC high-voltage generator of 6,600 V is tested, a voltage of at least 3,819 V is applied per phase, as mentioned above. Even though an intermediate potential is applied to the testing unit/outer frame 11, a voltage of about 1,910 V is applied to the load resistor assembly 10. In other words, the load resistor assembly 10 must have a dielectric strength of at least 2,000 V. Unless the mount portions 35 in the rectangular frame are made up of insulating material such as glass fibers or ceramics, it is then likely that, during testing, discharge takes place from the load resistor assembly 10 toward the mount portions 35.

It is to be understood that the connecting terminals 5 are connected by connectors 14 to connect ten load resistor assemblies 10 in series.

Figure 3:
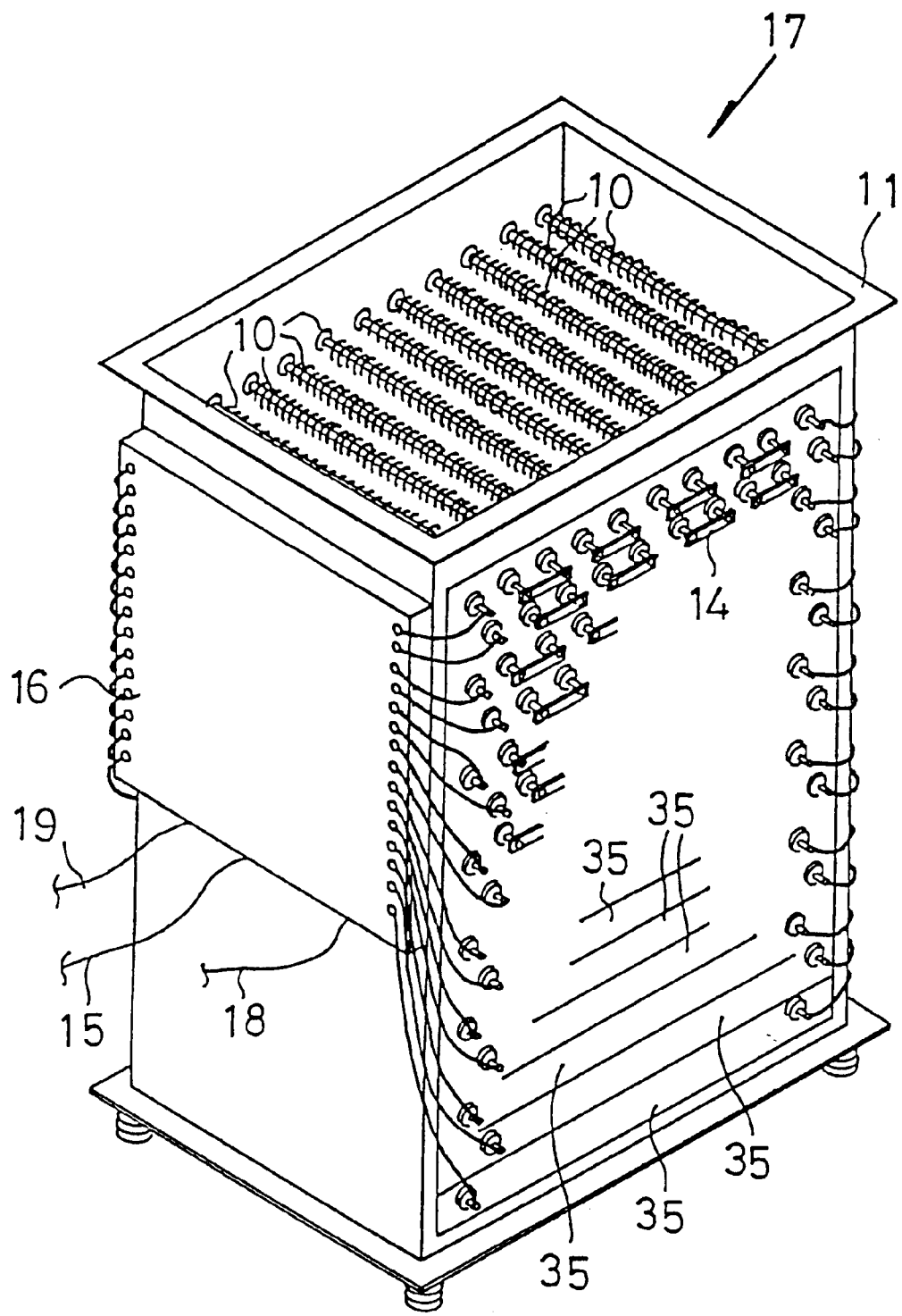
FIG. 3 is illustrative of how the embodiment of the invention is used.

FIG. 3 is a general perspective view of a load resistor assembly unit 17. As already stated, reference numeral 11 stands for a unit frame.

The load resistor assembly unit 17 is constructed by inserting and stacking 15 stages of resistor circuits 12 in the unit/outer frame 11.

In other words, 15 stages of the rectangular frames 13 are stacked in the unit/outer frame 11, although partly illustrated in FIG. 3.

Thus, 150 load resistor assemblies 10 are incorporated in a single load resistor assembly unit 17.

The aforesaid embodiment is provided by way of example alone. In other words, the number of resistor circuits 12 or load resistor assemblies 10 may be optionally changed.

It is here to be understood that the load resistor assemblies 10 in the resistor circuit 12 have a rated voltage of 400 V, a rated capacity of 1.67 KW and a dielectric strength of 2,000 V/min. or higher per assembly. In another parlance, one resistor circuit 12 has a capacity of 16.7 KW.

Here suppose one such unit as shown in FIG. 3 is used per phase. Then, it is possible to test a three-phase AC generator having a gross capacity of about 50 KW to about 750 KW.

For instance, when a dwarf generator of 50 KW is tested, three such loader units as shown in FIG. 3 are used in conformity with a three-phase AC generator. In this case, however, the uppermost stage of resistor circuit 12 alone is used. For testing a large generator of 750 KW, on the other hand, all three stages of resistor circuits 12 are used.

In the loader unit 17, a certain stage of resistor circuit 12 is located alternately with respect to upper and lower stages of resistor circuits 12 so that the respective load resistor assemblies 10 do not overlap with each other, thereby achieving sufficient heat radiation.

Figure 4:
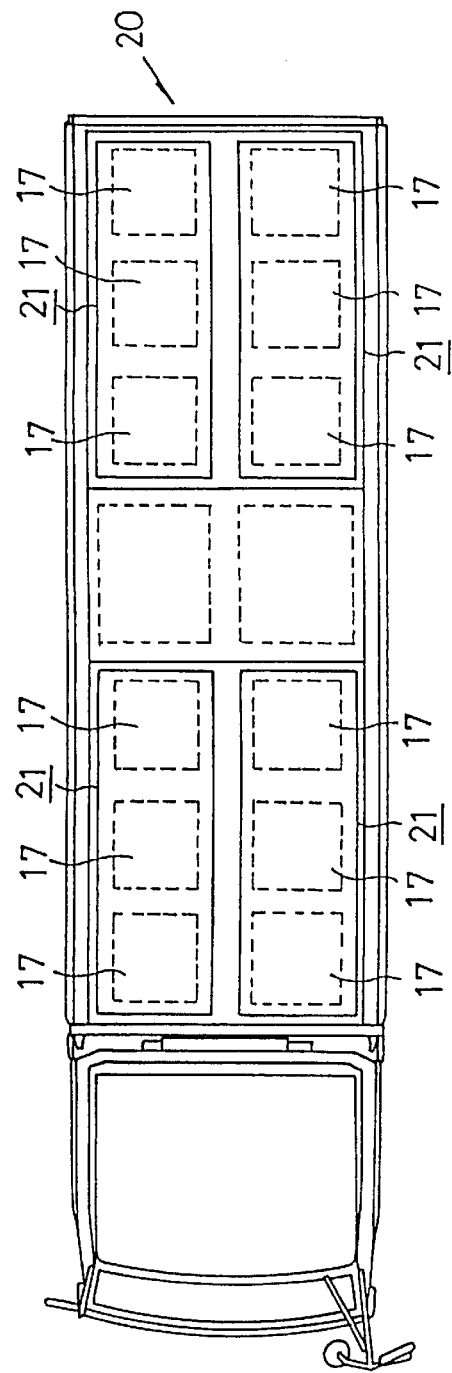
FIG. 4 is illustrative of how the embodiment of the invention is used.
Figure 5:
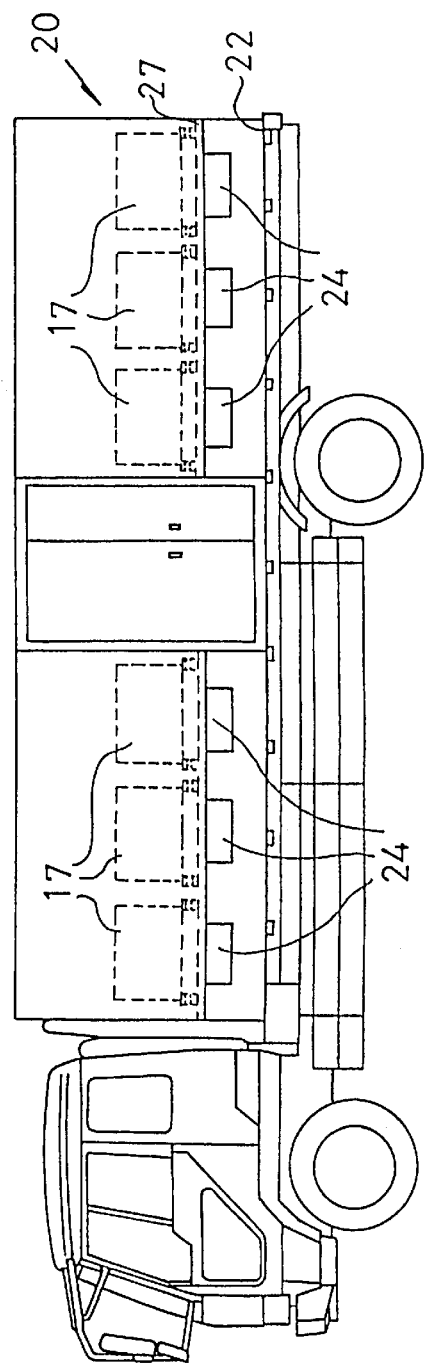
FIG. 5 is illustrative of how the embodiment of the invention is used.

FIGS. 4 and 5 show that a plurality of load resistor assembly units 17 of the invention are mounted on a movable truck.

Referring to FIG. 4, load resistor apparatus 21 (for three-phase AC purposes), each comprising three loader units 17, are mounted on a bed of a truck 20. In FIG. 5, reference numerals 22, 24, and 27 represent a truck bed, a cooling fan, and a mount frame, respectively.

Figure 6:
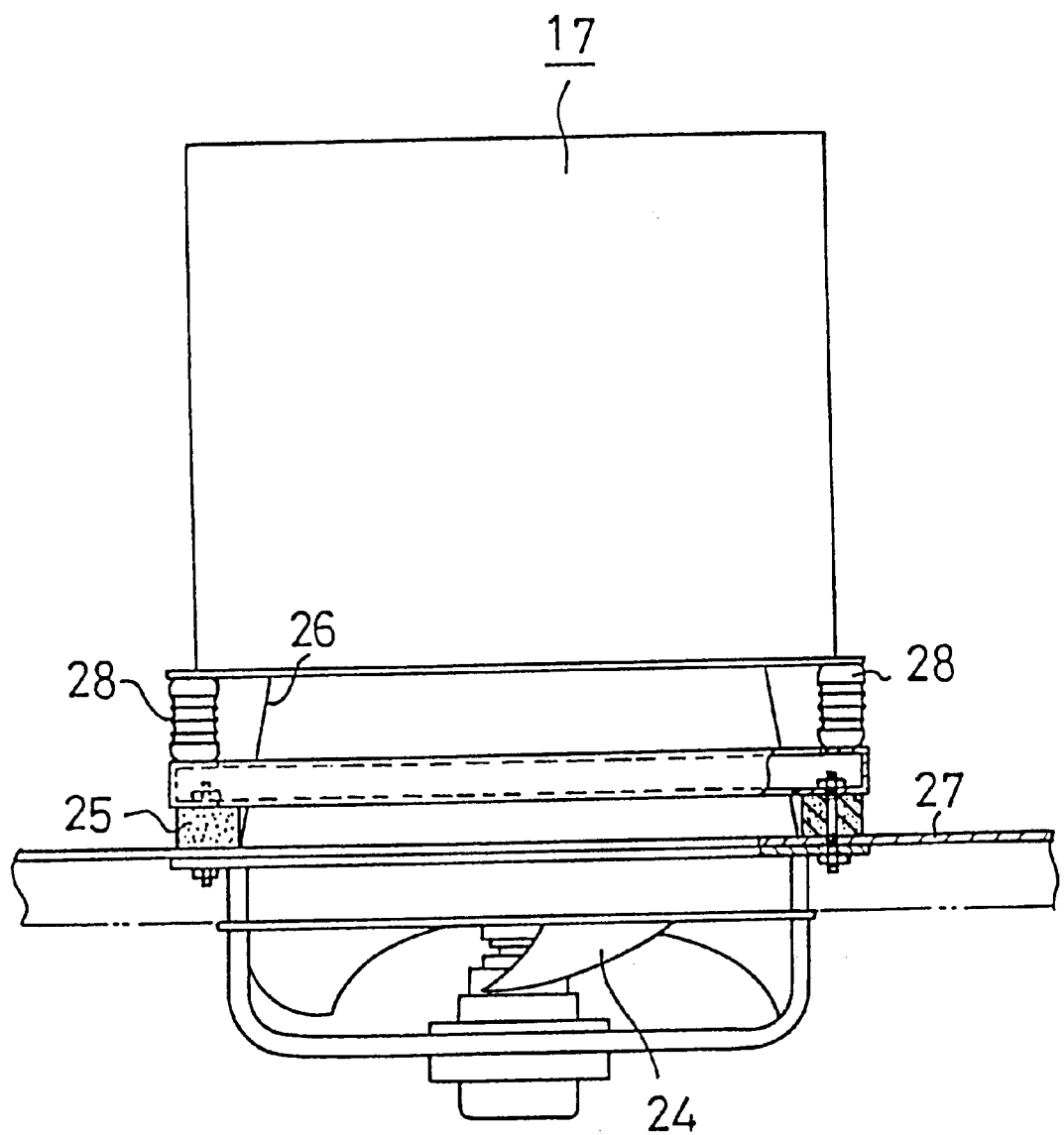
FIG. 6 is illustrative of how the cooling fan is mounted in place.

FIG. 6 is an enlarged view of a loader unit 17 mounted on the bed 22 of the truck 20. As can be seen from FIG. 6, the loader unit 17 is mounted on the bed 22 with a rubber vibration insulator 25 and an insulator 28 located therebetween to achieve high insulation.

The cooling fan 24 is located on a lower side of the loader unit 17, and fixed to the mount frame 27 with the rubber vibration insulator 25 disposed therebetween.

The load resistor assemblies 10 in the loader unit 17 are forcibly cooled by the cooling fan 24. A hood 26 is provided to efficiently guide air blown from the cooling fan 24 to the load resistor assemblies 10.

The load resistor assemblies 10 in the loader unit 17 are heated to a considerably high temperature upon feeding a current thereto. Due to the arrangement where the stages are vertically alternately located, this forcible cooling is efficiently achieved, so that even when tests are performed over a long period of time or repeatedly over a long period of time, the function and reliability of the load resistor assemblies are kept against the heat generated.

A generator to be subjected to load testing is usually of the three-phase AC type. Consequently, the number of the loader units 17 to be used should be a multiple of 3.

As illustrated in FIGS. 4 and 5, therefore, each of four load resistor apparatus 21 mounted on the truck 20 is made up of three loader units 17.

Figure 8:
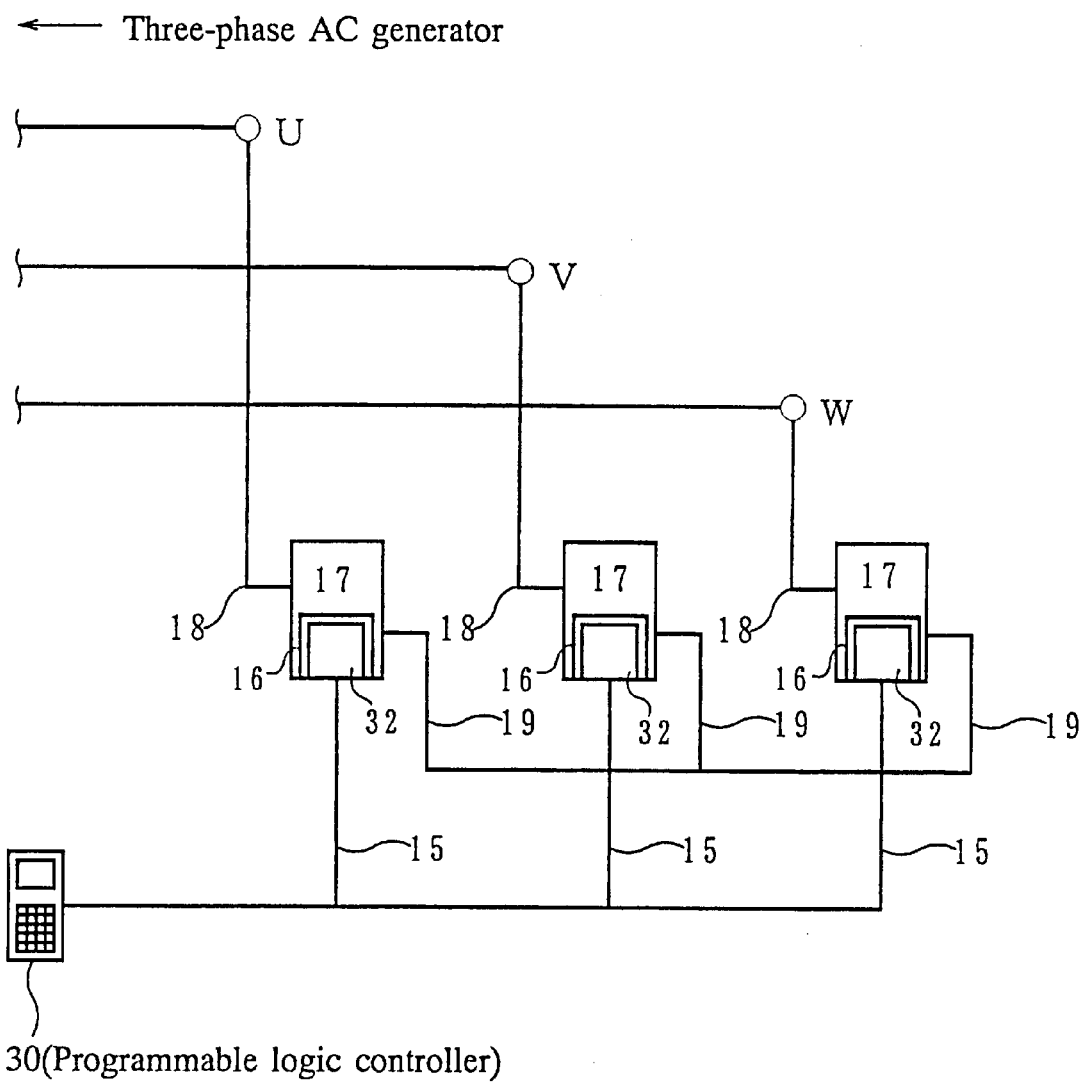
FIG. 8 is illustrative of connections in testing.

FIG. 8 shows connections for testing a generator using three loader units 16. As can be seen from FIG. 8, each loader unit 17 is connected to phases U, V, and W via power feeders 18, and to neutral points via power feeders 19.

As can be understood from FIG. 3, the loader unit 17 is provided on its side with a changeover unit 16 out of which a signal line 15 is led together with power feeders 18 and 19.

As can be understood from FIG. 8, the signal line 15 of each changeover unit 16 is connected to a programmable logic controller (PLC/PC) 30.

Figure 1:
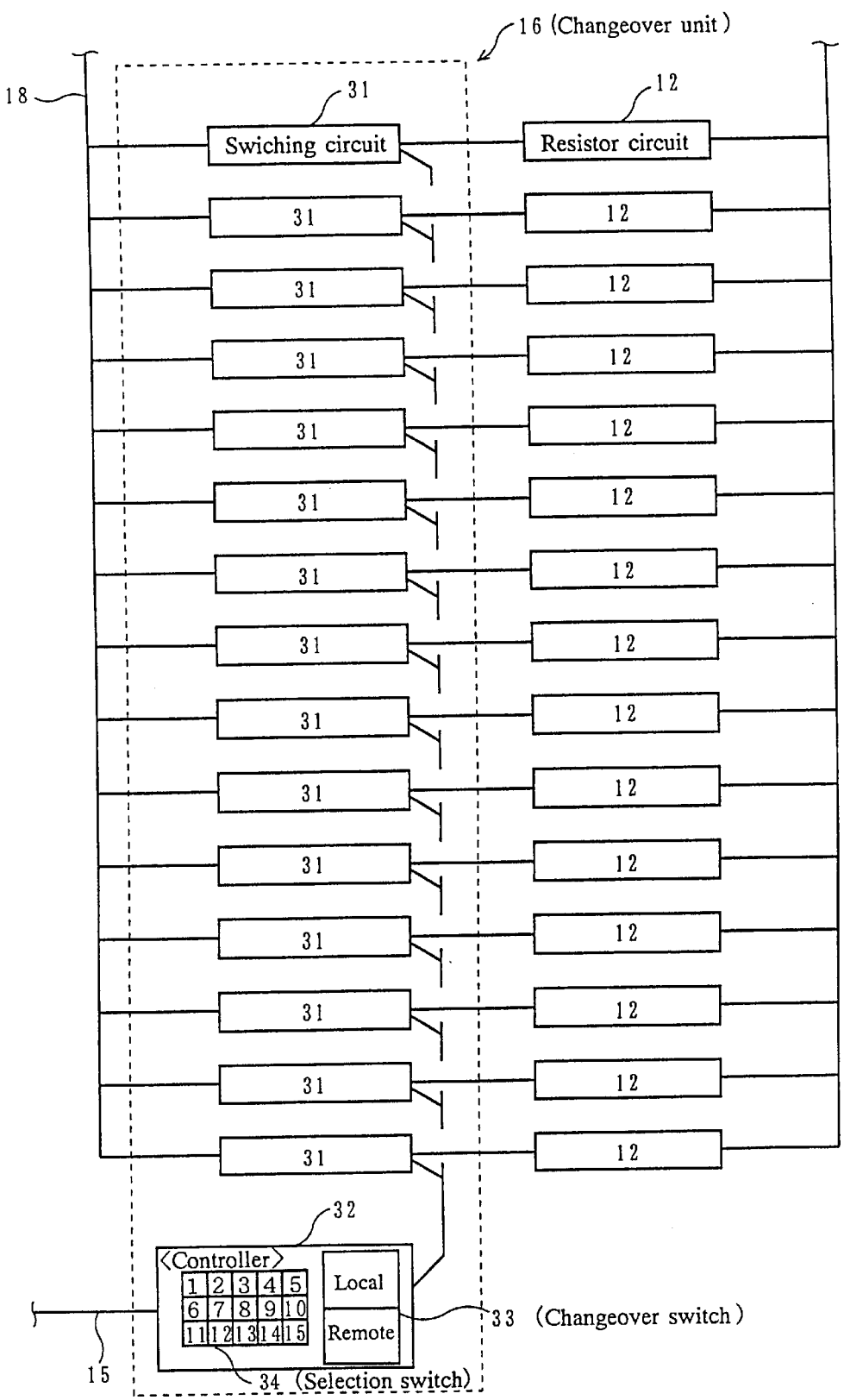
FIG. 1 is illustrative of a part of is one embodiment of the invention.

Referring here to FIG. 1, reference numerals 31 represent switching circuits connected in series with the associated resistor circuits 12 in the loader unit 17.

Each switching circuit 31 is constructed of a semiconductor switching element (thyristor, triod AC switch, etc.) for switching on or off a main power circuit (conduction path), a switching driving circuit for driving the semiconductor switching element, a current sensor for sensing a current passing through the main power circuit, and a voltmeter for detecting voltage.

Referring further to FIG. 1, a controller 32 is provided with a local/remote changeover switch 33, and a selection switch 34 for each resistor circuit 12.

The controller 32 has a built-in microprocessor, and waits for the selection switch 34 to turn on when the changeover switch 33 on the local side operates for testing.

Upon confirming that one or more of the selection switches 34 are turned on, the controller 32 waits for the changeover switch 33 to operate, and upon confirmation of the operation on the local side, the controller 32 sends a control signal to the switching circuit 31 corresponding to the selection switch 34 the on-operation of which is confirmed.

The control signal produced by the controller 32 is entered into the switching driving circuit at the switching circuit 31.

In response to the control signal input, the switching driving circuit drives on the semiconductor switching element to feed a current to the resistor circuit 12 connected in series therewith.

Upon the start of a current supply or upon the start of testing, the controller 32 monitors the operation of the changeover switch 33 on the local side, and the outputs of the current sensor and voltmeter in the switching circuit 31 that starts to feed a current to the resistor circuit 12.

Upon confirmation of the operation of the changeover switch 33 on the local side or upon detection of an abnormality in the current or voltage detected, the controller immediately sends, to the associated switching circuit 31, a control signal for shutting off the current supply to the resistor circuit 12 so that the switching driving circuit is allowed to drive off the semiconductor switching element to shut off the current supply to the resistor circuit 12 and thereby finish the test.

When the changeover switch 33 on the remote side operates upon the start of testing, the controller 32 awaits an instruction by the programmable logic controller 30 (see FIG. 8).

The programmable logic controller 30, with a logic sequence pre-stored therein, starts to execute the logic sequence when an operator presses a given key, and then sends to the controller 32 the instruction entered by the operator.

The operator of the programmable logic controller 30 enters instructions concerning which resistor circuit 12 is to be fed with a current and the start of a current supply.

Upon confirmation of the instructions from the programmable logic controller 30, the controller 32 sends a control signal corresponding to the instructions to the switching circuit 31.

At the switching circuit 31, the control signal sent out of the controller 32 is entered into the switching driving circuit.

The switching driving circuit drives on the semiconductor switching element to feed a current to the resistor circuit 12 connected in series therewith.

After the start of a current supply or testing, the controller 32 monitors instructions from the programmable logic controller 30, and outputs of the current sensor and voltmeter in the switching circuit 31 actuated to start a current supply to the resistor circuit 12.

Upon detection of an abnormality in the current and voltage sensed, notice to this effect is given to the programmable logic controller 30, and a control signal to shut off the current supply to the resistor circuit 12 is immediately sent to the associated switching circuit 31 so that the switching driving circuit drives off the semiconductor switching element to shut off the current supply to the resistor circuit 12.

Upon receipt of the notice concerning the abnormality, the programmable logic controller 30 provides a display of what abnormality occurs to inform the operator of the abnormality so that an instruction concerning an emergent shutoff of the current supply is given to the changeover unit 16 of other loader unit 17.

Upon receipt of the instruction to this effect, the controller 32 of the changeover unit 16 sends a control signal to immediately shut of the current supply to the associated resistor circuit 12.

After the lapse of a preset time or upon preset operation (for shutting off the current supply) executed, the programmable logic controller 30 sends to each controller 32 the same instruction as in the case of abnormality.

Preferably, the sequence for the programmable logic controller 30 is programmed by itself. However, it is acceptable to download the sequence from another computer.

The programmable logic controller 30 can place a considerable number of loader units 17 under control. When the number of loader units 17 exceeds an upper limit to control, however, they are hierarchically controlled by use of a host computer.

According to the embodiment as explained above, it is possible to improve the robustness of the main circuit switching portion at lower costs because the semiconductor element is used for the switching of the main current supply circuit.

The controller 32 can be used for each loader unit 17 to test a dwarf generator while each loader unit 17 is independently operated.

If the programmable logic controller 30 is used, it is then possible to control testing at a remote position, so that the testing can be performed in an automated manner and, hence, with safety.

Upon detection of an abnormality in currents or voltages, the testing stops automatically. If, in this case, the programmable logic controller 30 is used, it is then possible to give notice to the operator by providing a display of what abnormality occurs. It is thus unnecessary to rely upon a skilled operator.

In the invention, the switching circuit 31 is provided for each resistor circuit 12 in the load resistor unit 17 so that fine capacity alterations can be easily achieved without connection changeover.

Capacity differences between the loader units 17 connected in parallel, too, can be easily absorbed in an automated or manual manner.

By use of the programmable logic controller 30 or a host computer, it is possible to test a generator of some large size immediately or flexibly.

As explained above, the present invention can provide an inexpensive dry type load resistor which does not need water at all. In addition, the robustness of main circuit switching can be greatly increased more than ever before, with various added useful functions.

While the invention has been described with reference to a preferred embodiment, it will be understood by those skilled in the art that various changes may be made and equivalents may be substituted for element thereof without departing from the scope of the invention. Therefore, it is intended that the invention not be limited to the particular embodiment disclosed as the base mode contemplated for carrying out this invention, but that the invention will include all embodiments falling within the scope of the invention claims.

What we claim is:

1. A dry type load resistor unit for testing a generator, said unit comprising:

an outer frame (11);

a plurality of resistor circuits (12) housed in said outer frame (11), each of said resistor circuits (12) comprising a rectangular frame (13) and at least one load resistor assembly comprising a substantially cylindrical substrate material (1), a plurality of ring-like members (2) inserted over said substrate material (1) at a given interval in a longitudinal direction of said substrate material (1), a resistance material (3) inserted through said substrate material (1), an insulating member (4) filled between said resistance material (3) and an inner wall of said substrate material (1), and insulating members (6) located between both ends of said substrate material (1) and connecting terminals (5) disposed outside of said both ends of said substrate material (1) and connected to said resistance material (3), said plurality of resistor circuits (12) connected together via adjoining connecting terminals (5), and said plurality of resistor circuits (12) incorporated in said outer frame (11) in a plurality of stages while one stage of said resistor circuits (12) are located at a position where said resistor circuits (12) do not overlap upper and lower stages of said resistor circuits (12);

a plurality of switching circuits (31) each made up of a semiconductor element and each connected in series with one of said plurality of resistor circuits (12) so as to switch on or switch off a current supplied thereto based on a control signal;

a single controller (32) to which each of said switching circuits (31) are connected, wherein said single controller (32) is operable to send the control signal to each of said switching circuits (31); and a programmable logic controller (30) operable to send control instructions to said single controller (32).

* * * * *